United States Patent [19]

Lee et al.

[11] Patent Number: 4,785,466
[45] Date of Patent: Nov. 15, 1988

[54] ENCODER/DECODER CIRCUIT FOR B8ZS AND B6ZS APPLICATIONS

[75] Inventors: Grace H. Lee; Rolf H. G. Wendt; Ardeshir Hadaegh; Nirmal Virdee, all of Phoenix, Ariz.

[73] Assignee: Siemens Transmission Systems, Inc., Phoenix, Ariz.

[21] Appl. No.: 64,145

[22] Filed: Jun. 18, 1987

[51] Int. Cl.[4] .......................................... H04L 25/34
[52] U.S. Cl. ...................................... 375/17; 375/121
[58] Field of Search ......................... 375/17, 20, 121; 370/17, 84; 371/71

[56] References Cited

U.S. PATENT DOCUMENTS

| 4,408,325 | 10/1983 | Grover | 370/11 |
| 4,434,498 | 2/1984 | Mathieu | 375/114 |
| 4,503,546 | 3/1985 | Yoshine et al. | 375/94 |
| 4,509,164 | 4/1985 | Mouftah | 370/29 |
| 4,543,611 | 9/1985 | Kurahayashi | 358/260 |

FOREIGN PATENT DOCUMENTS

| 0201935 | 11/1986 | European Pat. Off. . |
| 2000522 | 3/1986 | Japan . |
| 8600482 | 1/1986 | PCT Int'l Appl. . |
| 1360859 | 6/1971 | United Kingdom . |
| 1349562 | 2/1972 | United Kingdom . |

Primary Examiner—Robert L. Griffin
Assistant Examiner—Marianne Huseman
Attorney, Agent, or Firm—Jeffrey P. Morris

[57] ABSTRACT

The present invention comprises a circuit for providing both B8ZS and B6ZS coding and decoding selectably with a single circuit. A rate control signal can, in preferred embodiment, be utilized to select the desired line code in a application dependent manner. Advantage is taken of the fact that there is a commonality in B8ZS and B6ZS code patterns in the last five bits of the codes, with the difference being the number of logic "zeros" before the first bit of coding.

22 Claims, 4 Drawing Sheets

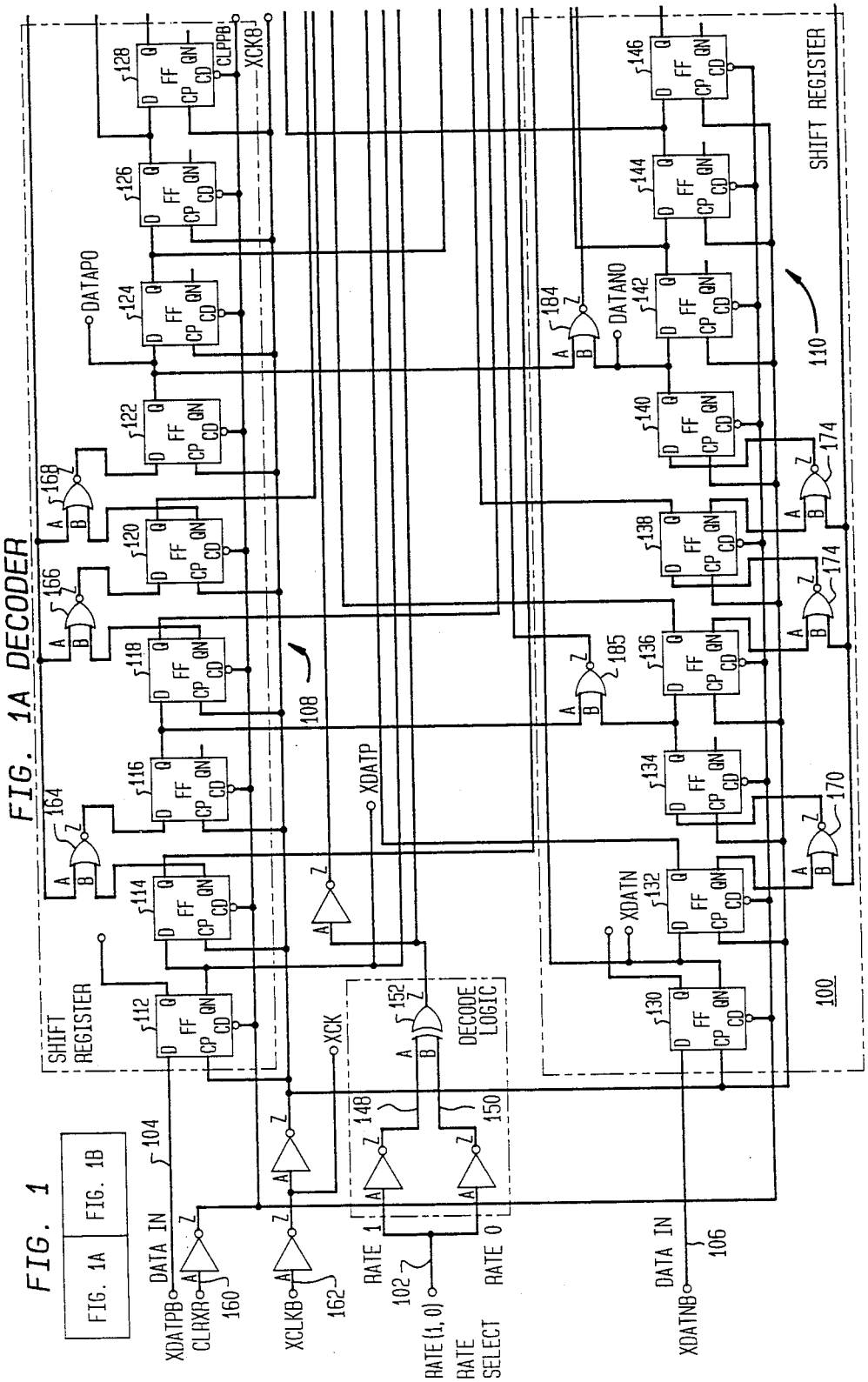
FIG. 1A DECODER

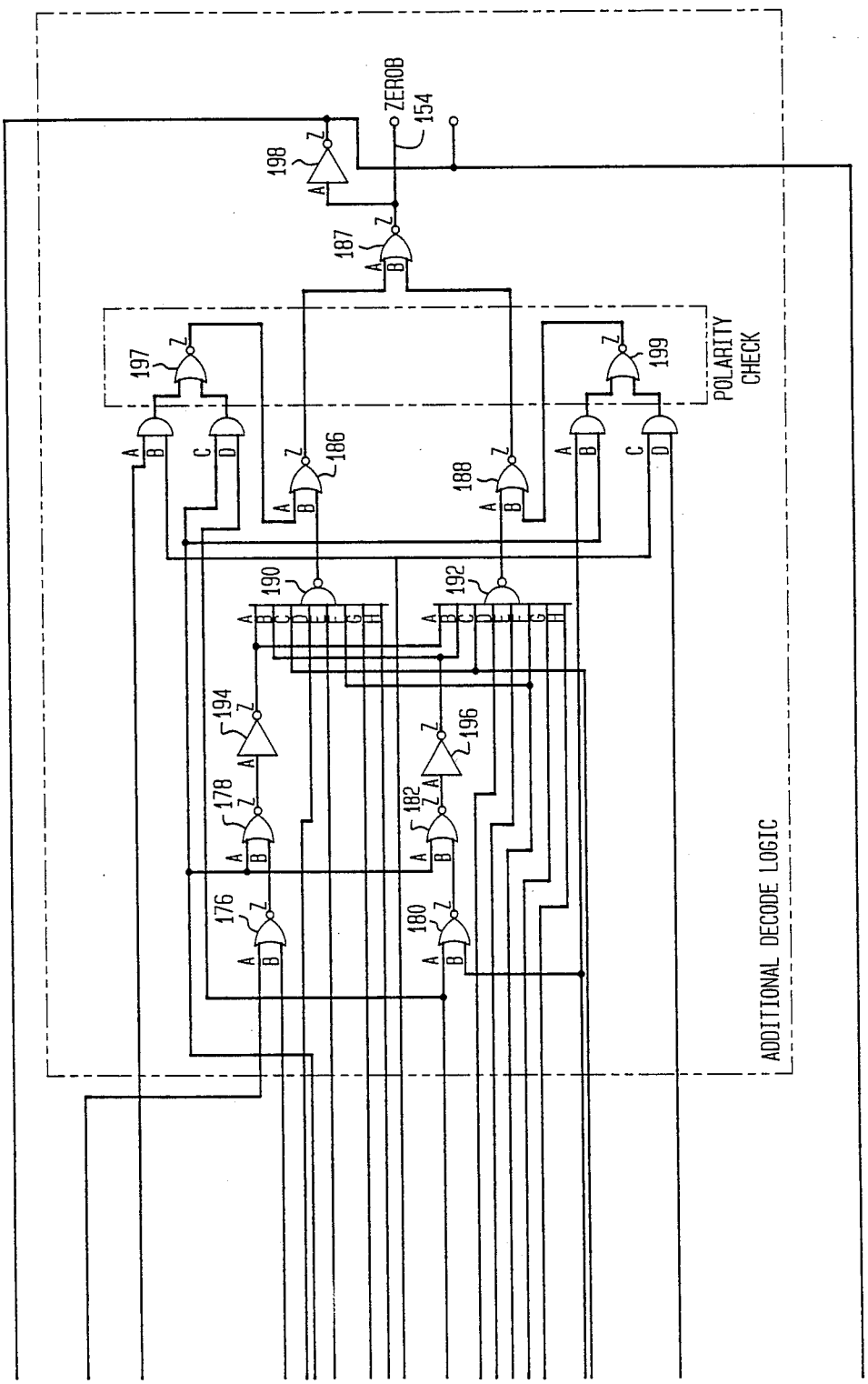
FIG. 1B DECODER

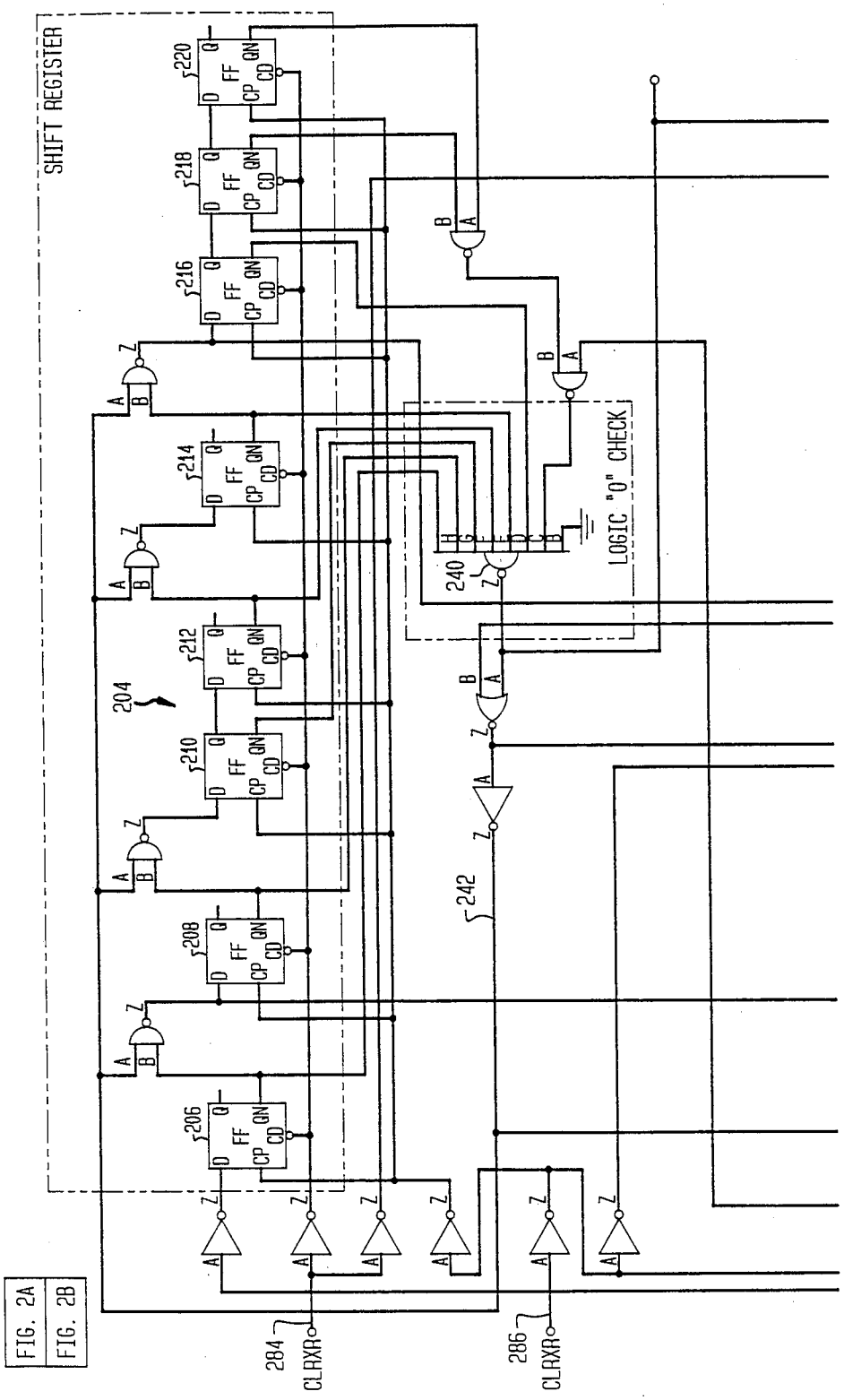
FIG. 2A ENCODER

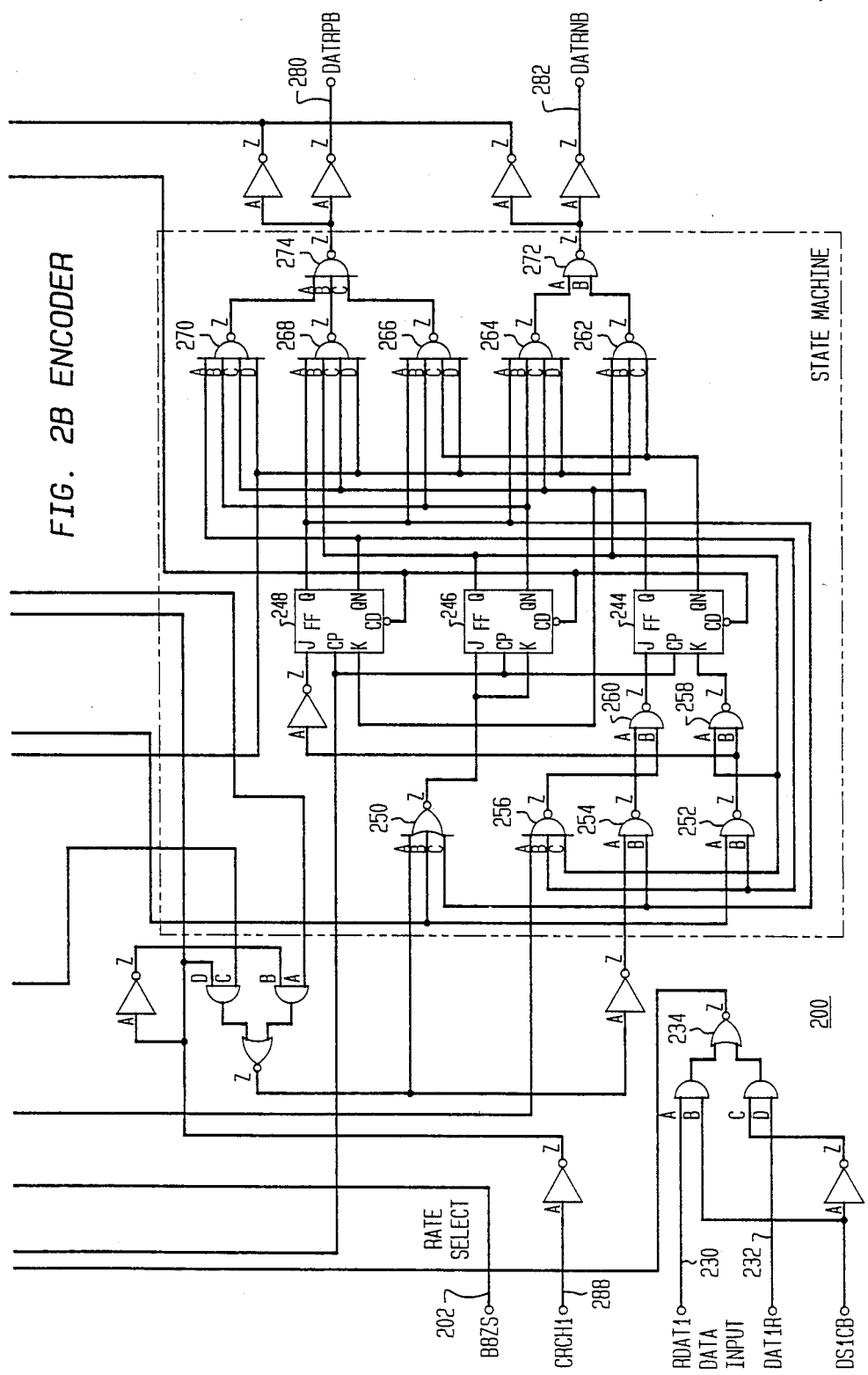
FIG. 2B ENCODER

ENCODER/DECODER CIRCUIT FOR B8ZS AND B6ZS APPLICATIONS

BACKGROUND OF THE INVENTION

1. Field of the Invention

The present invention relates generally to data encoding and transmission techniques for use in telecommunications equipment. More specially, the present invention relates to an improved encoding and decoding circuit for enabling data transmission without restriction on the quantity and sequence of logic "ones" and "zeros," such that all of the information carrying cabability of a communication channel can be effectively utilized. The circuit of the present invention provides, selectably, either B8ZS or B6ZS encoding and decoding depending upon whether a DS1/DS1C or a DS2 line interface is required.

2. Description of the Prior Art

The Integrated Services Digital Network (ISDN) in its implementation in the North American digital telecommunications transmission network requires a full or unconstrained clear channel capability for 64-kilobit per second (Kb/s) communication channels. One encoding technique known as Zero-Byte Time Slot Interchange (ZBTSI) is a well known technique for providing clear channel capability, also known as bit-sequence independence, over DS1 transmission carrier facilities within the North American telephone network. Other line codes used as standardized line codes for providing the 64K bit clear channel capability for DS1, DS1C and DS2 signal transmission are B8ZS and B6ZS line codes, where B8ZS is "bipolar with eight zeros substitution" and B6ZS in "bipolar with six zeros substitution. At present, the North American telephone network limits the number of consecutive logic "zeros" that can be transmitted because the existing bipolar line code does not transmit any pulses for a logic "zero." As a result, the transmission of long strings of logic "zeros" can cause telecommunications line haul equipment such as multiplexers and protection switches to lose timing accuracy or clock recovery altogether.

As is well known, a single PCM telecommunications channel, known as a "DS0" channel, operates at 64 kilobits per second (Kb/sec) in each direction of transmission to transmit and receive 8,000 8-bit samples per second of a desired telecommunication, be it voice or data. According to the Bell standard, individual two-way channels are multiplexed into higher speed channels for long distance transmission. As a particular example, 24 8-bit samples, one from each DS0 channel, are arranged serially in a single transmission frame together with a single framing bit to form a 193-bit frame. Transmission of successive 193-bit frames at a rate of 8,000 frames per second determines the bit rate of 1.544 Mb/sec. Set forth in the following table are some of the Bell standard digital transmission lines or hierarchical levels with their associated transmission rates and numbers of channels:

TABLE 1

| Transmission Line | Number of Voice Channels | Transmission Rate |
|---|---|---|
| DS0 | 1 | 64 Kb/sec. |
| DS1 | 24 | Approx. 1.5 Mb/sec. |
| DS1C | 48 | Approx. 3 Mb/sec. |
| DS2 | 96 | Approx. 6 Mb/sec. |
| DS3 | 672 | Approx. 45 Mb/sec. |

TABLE 1-continued

The standard for digital carrier multiplexers operating to multiplex digital DS1, DS1C and DS2 T carrier transmission lines into a DS3 transmission line is set forth and discussed in the Bell *System Transmission Engineering Technical Reference* entitled "Digital Multiplexes, Requirements and Objectives" by the Director, Exchange Systems Design, AT&T (July, 1982). Digital multiplexers which are connected into the Bell System pulse code modulated T carrier telecommunications network must conform with this standard.

In order to properly encode the highest analog frequency of a voice channel, the sampling rate has been established at 8000 samples per second. This sampling rate is also the frame rate for the DS1 signal. Each sample is encoded into an eight-bit word, which permits the dynamic range of the human voice to be mapped over 256 discrete steps in amplitude. With 8000 samples per second times 8 bits per sample, the result is 64 Kb/s for each of the individual DS0 channels. It seems reasonable that only the all-zero byte need be restricted, which would offer the ratio 255/256 efficiency, or 99.6 percent of the 64 kb/s channel, as unconstrained information bits for channel users. Unfortunately, existing equipment is not nearly this efficient.

Analog voice signals with associated signaling are coded into the 64 Kb/s channels using a combination of robbed-bit signaling and zero code suppression to guarantee the presence of at least one logic "one" in each byte. For digital data channels, a different technique is employed to ensure that the proper ones density is maintained. During transmission of customer digital data, a designated control bit is forced to a logic "one" on a full-time basis. Since the sampling rate remains at 8000 samples per second and there are now only 7 bits per sample available to the channel users, the effective unconstrained information rate to the channel user reduces to 56 Kb/s.

All of the transmission equipment source/sink designs which do not provide for clear channel capability employ at least one of the aforementioned techniques, which reduce the available information bits in the 64 Kb/s channels.

This includes virtually all such equipment currently in use in the North American telecommunications network. With the advent of ISDN, some scheme of restoring user access to the full 64 Kb/s channel without restriction on the quantity and sequence of ones and zeros is required. The same requirement exists for all remaining ISDN primary-rate interfaces. The provisioning of clear channel capability requires that new source/sink devices such as PCM terminals allow unconstrained primary-rate digital signals to enter and leave the network intact, and also continue to maintain the minimum pulse density requirements toward line-haul elements. Line-haul elements include repeaters, multiplexers, and automatic protection switches. To this extent, the North American network is not operating with clear channel capability with any of the known prior art techniques currently operational. The clear channel capability function is actually a synthesized condition, converting the clear channel signal to a form which can be transported by the line-haul network elements, then back to the original signal at the far-end source/sink device.

In known prior art, several B8ZS decoders and encoders were implemented for the DS1 and DS1C signals and several B6ZS decoders and encoders were implemented for the DS2 signal. The present invention is a simplified circuit combining both B8ZS and B6ZS decoder and encoder circuits in a single circuit, and including rate control circuitry to selectably adjust the circuit for either B8ZS or B6ZS line code, depending upon the transmission requirements, whether DS1/DS1C or DS2, and with approximately a fifty percent reduction in the circuitry of the prior art approach.

SUMMARY OF THE INVENTION

The present invention comprises a circuit for providing both B8ZS and B6ZS coding and decoding selectably with a single circuit. A rate control signal can, in a preferred embodiment, be utilized to select the desired line code in an application dependent manner. Advantage is taken of the fact that there is a commonality in B8ZS and B6ZS code patterns in the last five bits of the codes, with the difference being the number of logic "zeros" before the first bit of coding.

BRIEF DESCRIPTION OF THE DRAWINGS

FIGS. 1A and 1B illustrate a B8ZS and B6ZS decoder in accordance with the present invention.

FIGS. 2A and 2B illustrate a B8ZS and B6ZS encoder in accordance with the present invention.

DESCRIPTION OF THE PREFERRED EMBODIMENT

Telecommunications transmission signals at the DS1 and DS1C transmission rates use B8ZS encoding for zero code suppression, as aforementioned. The decoder substitutes eight logic "zeros" in place of the B8ZS code pattern in the incoming (transmit) data. Conventional B8ZS coding patterns for eight data bits are shown in the table below:

TABLE 2

| Preceding pulse | Next 8-bits |
|---|---|
|   | 000VB0VB |
| + | 000+−0−+ |
| − | 000−+0+− | where:
a "+" data bit has positive polarity;
a "−" data bit has negative polarity;
"V" represents a bipolar violation wherein a data bit has the same polarity as the preceding bit; and
"B" represents a normal bipolar bit wherein a data bit has alternated polarity from the preceding bit.

The reverse of the above takes place for received data. When eight consecutive logic "zeros" are detected, one of the above 8BZS code patterns is substituted by the B8ZS encoder, depending upon whether the preceding bit polarity is positive or negative.

Telecommunications transmission signals at the DS2 transmission rate use B6ZS encoding for zero code substitution. The decoder substitutes six logic "zeros" in place of the B6ZS code pattern in the incoming (transmit) data when either of the B6ZS code patterns listed in the table below are present.

TABLE 3

| Preceding pulse | Next 6-bits |
|---|---|
|   | 0VB0VB |
| + | 0+−0−+ |
| − | 0−+0+− |

The reverse of the above takes place for the received data. When six consecutive logic "zeros" are detected, one of the above B6ZS code patterns is substituted by the B6ZS encoder, depending upon whether the preceding bit polarity is positive or negative.

As can be seen from tables 2 and 3, there is a commonality between the last five bits in the B8ZS and B6ZS code patterns. The patterns differ only in the number of logical "zeros" before the first bit of coding. Advantage is taken of this coding commonality to provide a line decode/encode circuit for both B8ZS and B6ZS coding.

Referring now to FIG. 1, a B8ZS/B6ZS decoder for decoding the common five bits and the preceding zeros in the B8ZS/B6ZS data is illustrated generally at 100. The foregoing decoding is dependent upon decode selection signals on line 102 representative of RATE 0 and RATE 1 which are determinative of the line rate, either DS1/DS1C or DS2. The correspondence of the rate decoding to the line rates is shown by the table below.

TABLE 4

| Line Rate | Rate 1 | Rate 0 | Code |
|---|---|---|---|
| DS1 | 0 | 1 | B8ZS |
| DS1C | 1 | 0 | B8ZS |
| DS2 | 1 | 0 | B6ZS |

The decoder circuit 100 checks the common five bits of code when the data XDATPB (transmit data positive rail) and XDATNB (transmit data negative rail) on lines 104 and 106 respectively is clocked into two 9-bit shift registers 108 and 110. Shift register 108 is comprised of flip flops 112 through 128 and shift register 110 is comprised of flip flops 130 through 146. The number of "zeros" in the incoming code patterns are checked in accordance with the rate control inputs on lines 148 and 150 which are exclusively OR'ed at gate 152 which decodes whether the decoder function as a B6ZS or B8ZS decoder. If all of the bits match one of the line codes, the output signal ZEROB, (the B6ZS/B8ZS code flag) on line 154 is caused to become active low and resets all of the bits to "zeros" and replaces the B8ZS or B6ZS code by the "zeros."

The clear input CLRXR on line 160 and the clock input XCLKB on line 162 are coupled to shift register 108. The common pattern is decoded by looking at the last five bits (in flip flops 114, 116, 118, 120, 122 and in flip flops 132, 134, 136, 138, 140). If B8ZS code is decoded, the leading two bits after the preceding bt are bypassed for decoding for the B6ZS code. This is controlled by the output of Exclusive OR gate 152. If B8ZS is decoded, then all of the eight bits after the preceding bit are used for decoding. The dual input NOR gates 164 through 188 together with the 8-input NAND gates 190 and 192 and the inverters 194, 196, and 198 are arranged as shown to implement the decoding. Polarity of the preceding bit is checked at gates 197 and 199.

Referring now to FIG. 2, a B8ZS/B6ZS encoder circuit is illustrated generally at 200, which functions to accomplish the reverse operation of the decoder of FIG. 1. The rate select input control signal B8ZS on line 202 determines the line rate selection of either B6ZS or B8ZS. The received data on lines 230 and 232 is selected at gate 234 and shifted into an 8-bit shift register 204 comprised of flip flops 206 through 220. If the B8ZS control signal on line 202 is a logic "one," then all eight bits must be logic "zeros38 for the encoding to take place. If the B8ZS control signal on line 202 is a logic "zero," then the first two of the eight bits are masked, and the encoding will take place when six logic "zeros" are detected. Depending on the logic level of the B8ZS input, the 8 input NAND gate 240 checks for six "zeros" when B8ZS is logic "0" or for eight zeros when B8ZS is logic "1." The "VBOVB" code is inserted by the signal at the inverter 242 output when eight (for B8ZS) or six (for B6ZS) zeros are detected. The control logic for outputing the VBOVB code is controlled by a state machine, which consists of J-K flip-flops 244, 246 and 248, a three input NOR gate 250 and NAND gates 252 through 274. The control state machine generates the outputs DATRPB (data positive output) and DATRNB (data negative output) on lines 280 and 282 respectively, which contains the two rail data with the B6ZS or B8ZS patterns. The clear input (CLRXR) on line 284 and the clock input (RDCK1B) on line 286 and the clear channel enable input to enable encoding (CRCH1) on line 288 are as shown.

While the present invention has been described in connection with a preferred embodiment thereof, it is to be understood that additional embodiments, modifications and applications that will become apparent to those skilled in the art are included within the spirit and scope of the invention as set forth by the claims appended hereto.

What is claimed is:

1. A circuit for decoding B8ZS and B6ZS line codes comprising:
    data input means for receiving both B8ZS and B6ZS input data, said input data including common line code pattern bits;
    decoding logic for decoding a rate control input signal for generating an output representative of whether said input data is B8ZS line code or B6ZS line code;
    shift register means for temporarily storing said received input data, including means for decoding the last five bits of each data byte to decode said common line code pattern bits in each of the B8ZS and B6ZS line codes;
    additional decoding logic means coupled to said input data for decoding the number of logic zeros preceding said last five bits of each data byte in accordance with said rate control input signal; and
    means for substituting either eight logic zeros for a detected B8ZS code or six logic zeros for a detected B6ZS code in accordance with the decoding by said additional decoding logic means.

2. A circuit in accordance with claim 1 wherein said decoding logic for decoding said rate control input signal includes means for extracting logic signals indicative of two transmission rates from said rate control signal.

3. A circuit in accordance with claim 2 further including:
    a clock input; and
    means for shifting said input data into said shift register means with the first bit of the previously stored data byte.

4. A circuit in accordance with claim 2 wherein said decoding logic for decoding said rate control input signal decodes B6ZS code when said logic signals indicative of two transmission rates are each a different logic level, and for decoding B8ZS code when said logic signals indicative of two transmission rates are both logic one level.

5. A circuit in accordance with claim 2 wherein said decoding logic for decoding said rate control input signal decodes B6ZS code when said logic signals indicative of two transmission rates are both logic one level, and for decoding B8ZS code when said logic signals indicative of two transmission rates are of different logic levels.

6. A circuit in accordance with claim 1 further comprising means for encoding said B8ZS and said B6ZS line codes into said input data.

7. A circuit for encoding B8ZS and B6ZS line codes comprising:
    data input means for receiving bytes of input data;
    means for deriving a rate selection control signal;
    shift register means for receiving said input data bytes for temporary storage;
    means for detecting a predetermined logic condition in said input data; and
    means responsive to said detected predetermined logic condition for encoding said temporarily stored data by substituting a code pattern for the temporarily stored input data, such that said code pattern substitution is made when six logic zeros are detected in said stored data when said rate selection control signal is at a logic level indicative of B6ZS line code, and said code pattern substitution is made when eight zeros are detected in said stored data when said rate selection control signal said at a logic level indicative of B8ZS line code.

8. A circuit in accordance with claim 7 wherein said means for encoding said temporarily stored data includes means for detecting the number of logic zeros in said stored data.

9. A circuit in accordance with claim 8 wherein said substituted code pattern is in the form VBOVB where V indicates a bipolar violation, B is a bipolar bit with alternated polarity from the preceding bit and O is a logic zero.

10. A circuit in accordance with claim 9 wherein a different VBOVB code patern is substituted in accordance with the polarity of the preceding bit.

11. A circuit in accordance with claim 8 further including a state machine means and gating logic for masking the first two temporarily stored input data bits when the code pattern substitution is made after detecting six logic zeros.

12. A circuit in accordance with claim 11 further including means for outputting said VBOVB code with either B6ZS of B8ZS line code patterns.

13. A circuit in accordance with claim 7 further comprising means for decoding said encoded B8ZS and B6ZS line codes.

14. A method for decoding B8ZS and B6ZS line codes comprising the steps of:
    receiving both B8ZDS and B6ZS input data, said input data including common line code pattern bits;
    decoding a rate control input signal to generate an output representative of whether said input data is B8ZS line code or B6ZS line code;
    temporarily storing said received input data;

additional decoding logic means for decoding the last five bits of each data byte to decode said common line code pattern bits in each of the B8ZS and B6ZS line codes;

decoding the number of logic zeros preceding said last five bits of each data byte in accordance with said control input signal; and substituting either eight logic zeros for a detected B8ZS code or six logic zeros for a detected B6ZS code in accordance with the decoding by said additional decoding logic means.

15. A method in accordance with claim 14 wherein said rate control input signal is indicative of two transmission rates.

16. A method in accordance with claim 15 wherein decoding said rate control input signal decodes B6ZS code when said signals indicative of two transmission rates are each a different logic level, and decodes B8ZS code when said signals indicative of two transmissions rates are both logic one level.

17. A method in accordance with claim 15 wherein decoding said rate control input signal decodes B6ZS code when said signals indicative of two transmission rates are both logic one level, and deocdes B8ZS code when said signals indicative of two transmission rates are of different logic levels.

18. A method for encoding B8ZS and B6ZS line codes comprising:

receiving bytes of input data;

deriving a rate selection control signal;

receiving said input data bytes for temporary storage;

detecting a predetermined logic condition in said detected input data; and encoding said temporaily stored data by substituting a code pattern for the temporarily stored input data, such that said code pattern substitution is made when six logic zeros are detected in said stored data when said rate selection control signal is at a logic level indicative of B6ZS line code, and said code pattern substitution is made when eight logic zeros are detected in said stored data such that said rate selection control signal is at a logic level indicative of B8ZS line code.

19. A method in accordance with claim 18 wherein said substituted code pattern is in the form BVOVB where V indicates a bipolar violation, B is a bipolar bit with alternated polarity from the preceding bit and O is a logic zero.

20. A method in accordance with claim 19 wherein a different BVOVB code pattern is substituted in accordance with the detected polarity of the preceding bit.

21. A method in accordance with claim 18 wherein the first two temporarily stored input data bits are masked when the code pattern substitution is made after detecting six logic zeros.

22. A method in accordance with claim 21 further including the step of outputting said BVOVB code with either B6ZS or B8ZXS line code patterns.

* * * * *